United States Patent [19]

Coleman

[11] 3,825,994

[45] July 30, 1974

[54] METHOD OF SOLDERING CIRCUIT COMPONENTS TO A SUBSTRATE

[75] Inventor: Clyde Franklin Coleman, Crawfordsville, Ind.

[73] Assignee: RCA Corporation

[22] Filed: Nov. 15, 1972

[21] Appl. No.: 306,839

[52] U.S. Cl. .......................... 29/498, 29/626, 228/37

[51] Int. Cl. .......................... B23k 31/02, B23k 35/24

[58] Field of Search ............. 29/493, 498, 626, 503, 29/473.1, 589; 228/39, 36, 37, 25, 56

[56] References Cited

UNITED STATES PATENTS

| | | | |
|---|---|---|---|
| 2,182,364 | 12/1939 | Smith | 29/498 UX |
| 3,054,174 | 9/1962 | Rose et al. | 29/503 X |
| 3,110,100 | 11/1963 | Hill | 29/473.1 |
| 3,205,572 | 9/1965 | Jochems | 29/498 X |
| 3,386,166 | 6/1968 | Tardoskegyi | 29/471.1 X |
| 3,500,536 | 3/1970 | Goldshmied | 228/37 X |
| 3,588,998 | 6/1971 | Coraro | 29/493 X |
| 3,690,943 | 9/1972 | Popiano | 228/37 X |
| 3,742,181 | 6/1973 | Costello | 29/626 X |

*Primary Examiner*—J. Spencer Overholser
*Assistant Examiner*—Ronald J. Shore
*Attorney, Agent, or Firm*—Glenn H. Bruestle; William S. Hill

[57] ABSTRACT

A method of batch soldering components of hybrid circuits to substrates comprising advancing the substrates having mounted thereon solder paste layers or preforms on which the components are resting in unsoldered state, along a path which leads through a wave of hot, dense liquid, such that the substrates float free on the liquid wave for a period long enough to melt the solder paste or preform, and then moving the substrates out of contact with the liquid wave to cool the assemblies which now have the components soldered down to them.

6 Claims, 3 Drawing Figures

METHOD OF SOLDERING CIRCUIT COMPONENTS TO A SUBSTRATE

BACKGROUND

One of the cost advantages in thick-film hybrid circuit manufacture is that components such as transistors, diodes and capacitors do not have to be connected to circuit terminals on a substrate by hand-soldering wires. Instead, the terminals on the substrate are provided with layers of solder paste or solder preforms, the circuit components are disposed on the substrate such that solder-coated electrodes on the components are matched to the proper areas of solder paste (or preform) on the substrate, and heat is applied to melt the solder of all components instantaneously. This method of electrically connecting circuit components to substrates has not only lowered circuit cost, it has raised the reliability and shock resistance of the circuits..

Heat to melt the solder layers has usually been supplied by methods such as passing heated air over the circuits as they pass through an oven, by infra-red lamps, radiant heat from other sources, or by contact with a hot plate. However, all of these heating methods apply heat unevenly and some of them subject the components to relatively high temperatures for times which are undesirably long. It is desirable to have a method of applying heat more uniformly and efficiently to the places where it is needed, while maintaining the circuit components, themselves, at temperatures below which they could be harmed.

THE DRAWING

DESCRIPTION OF PREFERRED EMBODIMENTS

The present method may be advantageously applied to mounting circuit components, such as transistors and capacitors, on ceramic substrates which have previously had a network of printed conductors and resistors deposited thereon. The circuits, with the components loosely resting on them, are moved along, in succession, over a pair of guide rails on which the substrates slide. They may first be run through a pre-heater to bring them to an intermediate temperature below that needed to melt areas of solder paste with which they have been provided and then they are moved into contact with a wave of heated liquid which is dense enough to cause the substrates to float freely out of contact with the rails. The substrates are confined horizontally, however. The heated substrates are moved across the liquid wave crest and the heat of the liquid is conducted uniformly up through the substrate, melting the areas of solder paste.

The circuits continue to move and emerge from the heated liquid where they are permitted to cool back down to room temperature with all of the terminals soldered.

Figure 1:
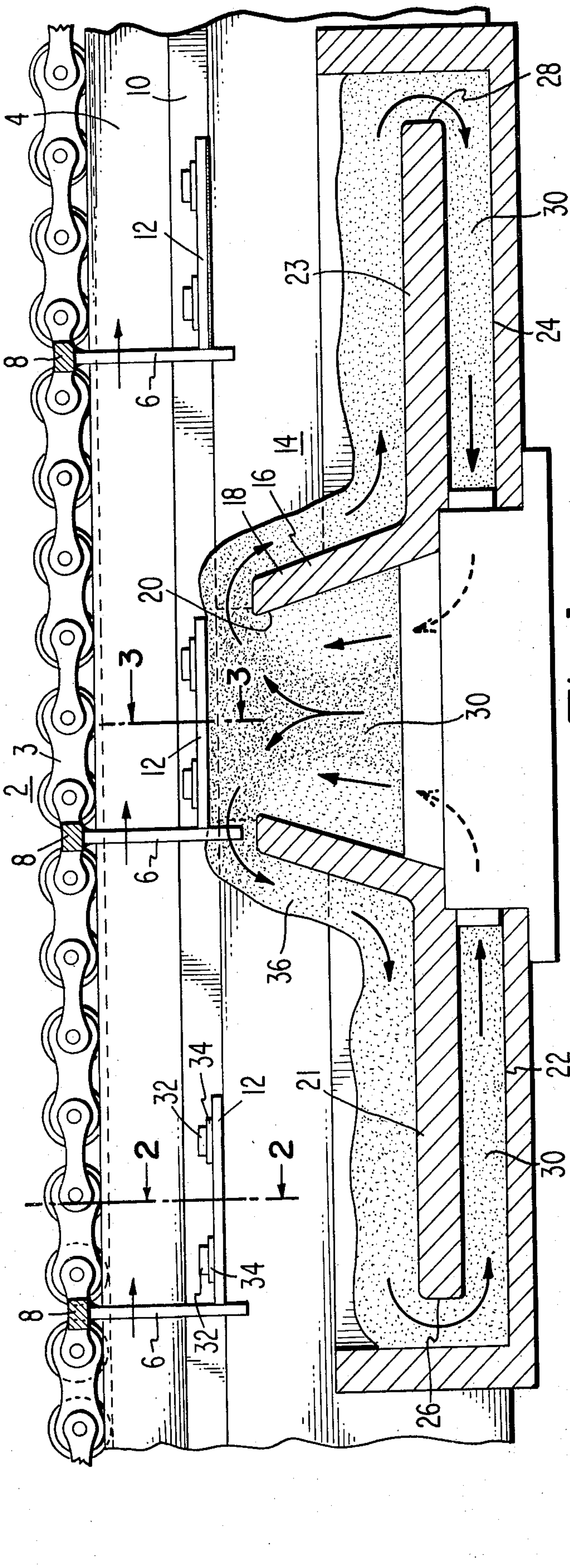
FIG. 1 is a partial elevation view, partly in section, of one embodiment of apparatus suitable for practicing the method of the present invention.

Referring now to FIG. 1, apparatus for carrying out the method of the invention comprises an endless conveyor 2 which includes a pair of parallel chains of rollers 3. The rollers are driven along a pair of horizontal rails 4 by conventional driving means (not shown). Spaced at regular intervals, a series of fingers 6, made of stainless steel, depend from the chain 2. The fingers 6 are attached to crossbars 8 and the crossbars 8 are attached at each end to one of the roller chains 3. There may be a plurality of fingers 6 attached to each crossbar 8.

Figure 2:
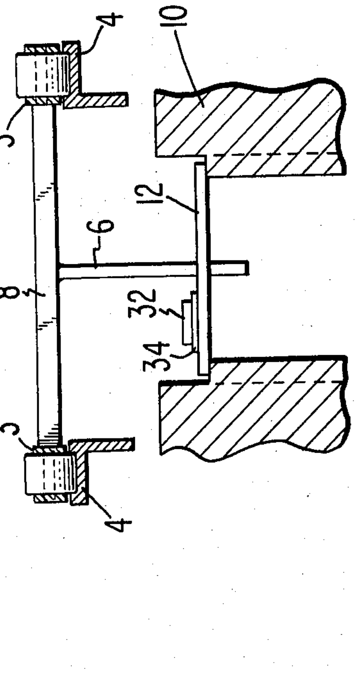
FIG. 2 is a partial section, partial elevation view taken along the line 2—2 of FIG. 1.
Figure 3:
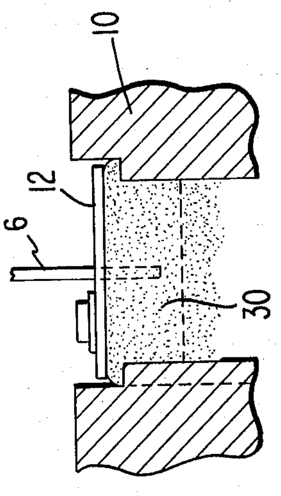
FIG. 3 is a partial section, partial elevation view taken along the line 3—3 of FIG. 1.

Spaced a short distance below the path of travel of the roller chains 3 but offset laterally toward the center of the system, is a pair of smooth-surfaced, L-shaped tracks 10. The tracks 10 are spaced apart a distance just large enough to accommodate circuit substrates 12 (FIG. 2). There may be a plurality of pairs of tracks 10 related to a single pair of roller chains 3.

Disposed near one end of the conveyor 2, below the tracks 10, is a liquid fountain 14. The fountain 14, which is composed of stainless steel, has a central elongated chamber 16 with inwardly tapering walls 18 and a top opening 20. The chamber 16 extends at least across the space between the tracks 10, or across the space occupied by all the tracks if there is a plurality of pairs of tracks. On both sides of the central chamber 16 are rectangular shaped conduits 22 and 24, elongated laterally like the chamber 16. The conduits 22 and 24 are connected at one end to the central chamber 16. The other ends have openings 26 and 28, respectively.

The top walls 21 and 23 of conduits 22 and 24 serve as baffles to direct liquid flow from the fountain opening 20 into the openings 26 and 28. The fountain 14 also has conventional electrical heating means (not shown) for maintaining the liquid 30 at a desired temperature, and conventional means (not shown) for keeping the liquid 30 in flowing motion.

In operation, the conveyor 2 moves in the direction shown. As the conveyor moves, fingers 6 push the ceramic substrates 12 along the tracks 10. The ceramic substrates 12 have circuit components 32 thereon. Each of the components 32 rests on a layer of solder paste 34. Instead of a layer of solder paste, a solder preform wafer may be used.

As the substrates 12 move along the tracks 10, they may first be passed through a preheater (not shown), which may be a bank of infra-red lamps, to bring the substrates up to a temperature somewhat lower than that needed to reflow the solder 34.

The substrates 12 then move to the fountain 14. Here the recirculating liquid 30, which in this case is solder, is emerging as a substantially flat-topped wave 36 from the opening 20. The liquid 30 of the fountain is maintained at a temperature somewhat higher than the melting point of the solder 34 which is beneath each component 32. As each substrate 12 rides across the crest of the liquid wave 36, it is buoyed up by the liquid and floats a short distance above the tracks 10. The liquid 30 is chosen to have a specific gravity which is higher than the combined specific gravities of the substrate 12 and components 32. The liquid 30 is also chosen to have a melting point (if it is a solid at room temperature) below the maximum temperature at which satisfactory flow or reflow of the solder 34 can be achieved, and it must also be non-wetting and chemically inert with respect to the substrates.

As each substrate 12 floats across the hot liquid wave 36, the solder 34 beneath each circuit component 32 melts and, as the substrate 12 emerges from the wave and settles back on the tracks 10, the solder 34 begins to re-solidify. Re-solidification is complete before the end of the conveyor is reached where the circuits slide off to be picked up for further processing.

I claim:

1. A method of soldering a circuit component to a first surface of a heat-resistant substrate having two opposed surfaces, comprising providing a solid layer of solder between said component and said first surface of said substrate, floating said substrate with the surface of said substrate which is opposite said first surface, on a liquid which has a greater specific gravity than the combined specific gravity of said substrate and said components, for a predetermined period, said liquid being chemically inert and non-wetting to said substrate, and being maintained at a temperature above the melting point of said solder, to melt said solder, and then removing said substrate from contact with said liquid to re-solidify said solder.

2. A method according to claim 1 in which said liquid is a solder composition.

3. A method according to claim 1 in which said liquid is maintained as a fountain and is continuously recirculated.

4. A method according to claim 1 in which said substrate is a ceramic.

5. A method according to claim 1 in which said substrate is pre-heated to a temperature below the melting point of said solder before it is floated on said liquid.

6. A method of soldering a circuit component to a first surface of a heat-resistant substrate having two opposed surfaces, comprising placing said component on said first surface of said substrate with a solid solder layer therebetween, moving said substrate and said component along a path at a certain level, bringing the surface of said substrate which is opposite said first surface, into contact with a wave of molten solder which has a greater specific gravity than the combined specific gravity of said substrate and component and which is at a temperature higher than the melting point of said solder layer, such that said substrate floats free as it moves across said solder wave and is heated to a temperature sufficient to melt the solder of said layer, and then removing said substrate from contact with said solder wave to resolidify the solder of said layer.

* * * * *